United States Patent
Choi et al.

(10) Patent No.: US 7,824,501 B2
(45) Date of Patent: Nov. 2, 2010

(54) IN-SITU METHOD OF CLEANING VAPORIZER DURING DIELECTRIC LAYER DEPOSITION PROCESS

(75) Inventors: Hoon-sang Choi, Seoul (KR); Jong-cheol Lee, Seoul (KR); Ki-vin Im, Gyeonggi-do (KR); Eun-ae Chung, Seoul (KR); Sang-yeol Kang, Gyeonggi-do (KR); Young-sun Kim, Gyeonggi-do (KR); Kwang-hee Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 503 days.

(21) Appl. No.: 11/781,334

(22) Filed: Jul. 23, 2007

(65) Prior Publication Data

US 2008/0121184 A1 May 29, 2008

(30) Foreign Application Priority Data

Nov. 28, 2006 (KR) ...................... 10-2006-0118557

(51) Int. Cl.
- B08B 9/08 (2006.01)
- B08B 3/08 (2006.01)
- B08B 3/10 (2006.01)
- B08B 5/00 (2006.01)

(52) U.S. Cl. ................ 134/22.1; 134/22.18; 134/22.19; 134/30; 134/31; 134/26

(58) Field of Classification Search ................ 134/22.1, 134/22.14, 30, 31; 118/715, 733
See application file for complete search history.

(56) References Cited

U.S. PATENT DOCUMENTS

| 5,362,328 A | * | 11/1994 | Gardiner et al. | ............. | 118/726 |
| 6,277,201 B1 | * | 8/2001 | Nishikawa | .................. | 118/726 |
| 2006/0216947 A1 | * | 9/2006 | Choi et al. | .................. | 438/763 |

FOREIGN PATENT DOCUMENTS

| JP | 2000-192243 | 7/2000 |
| JP | 2003-282449 | 10/2003 |
| KR | 1020050049696 A | 5/2005 |

* cited by examiner

*Primary Examiner*—Michael Kornakov
*Assistant Examiner*—Natasha Campbell
(74) *Attorney, Agent, or Firm*—Myers Bigel Sibley & Sajovec, P.A.

(57) ABSTRACT

Provided is an in-situ method of cleaning a vaporizer of an atomic layer deposition apparatus during a dielectric layer deposition process, to prevent nozzle blocking in the vaporizer and an atomic layer deposition apparatus. During the dielectric layer deposition process, the following steps are repeated: supplying a first source gas for dielectric layer deposition into a chamber of an atomic layer deposition apparatus; purging the first source gas; supplying a second source gas into the chamber of the atomic layer deposition apparatus; purging the second source gas, the in-situ method of cleaning the vaporizer is performed after supplying the first source gas for dielectric layer deposition and before supplying the first source gas again.

15 Claims, 3 Drawing Sheets

IN-SITU METHOD OF CLEANING VAPORIZER DURING DIELECTRIC LAYER DEPOSITION PROCESS

CROSS-REFERENCE TO RELATED PATENT APPLICATION

This application claims the benefit of Korean Patent Application No. 10-2006-118557, filed on Nov. 28, 2006, in the Korean Intellectual Property Office, the disclosure of which is incorporated herein in its entirety by reference.

FIELD OF THE INVENTION

The present invention relates generally to semiconductor devices and, more particularly, to semiconductor device manufacturing.

BACKGROUND OF THE INVENTION

In addition to chemical vapor deposition methods or physical vapor deposition methods, atomic layer deposition has recently been suggested as a method of forming thin films of semiconductor devices. In atomic layer deposition, thin films are formed on a wafer by alternately supplying at least two kinds of source gases required to obtain desired thin films into a chamber in which thin films are deposited. Atomic layer deposition is useful in forming high quality thin films and integrating semiconductor devices due to the ease of thickness control.

Meanwhile, in forming capacitors of semiconductor memory devices, more stabilized capacitance of capacitors is required as the size of semiconductor devices is reduced. However, obtaining more stabilized capacitance by reducing the thickness of dielectric layers or increasing the area of capacitors is becoming increasingly difficult. Therefore, research on using a dielectric layer having a high dielectric constant (k) to obtain stabilized capacitance is currently being conducted including research on replacing conventional dielectric layers formed of silicon oxide (dielectric constant 3.9), silicon nitride layer (dielectric constant 7.2), silicon nitride in a multi-layer structure and silicon oxide (ONO, dielectric constant 7.9~7.2) with other materials having high dielectric constants.

Examples of materials that can be used to form high-k dielectric layers to replace the above conventional dielectric layers include tantalum oxide (dielectric constant 20~60), hafnium oxide (dielectric constant 20), titanium oxide (dielectric constant 40), aluminum oxide (dielectric constant 10), lanthanum oxide (dielectric constant 20), etc. Also, ferroelectric multi-layer structures such as PZT (barium strontium titanate), BST (Lead zirconate titanate) and STO (strontium titanate oxide) can be used as dielectric layers.

However, precursors of the above-described materials that can be used to form high-k dielectric layers generally have relatively large molecular weights and exist in a solid state at room temperature. Thus, it is difficult to deposit the above-described materials when forming dielectric layers of semiconductor devices.

FIG. 1 is a flowchart illustrating a conventional atomic layer deposition method of forming dielectric layers.

Referring to FIG. 1, firstly a wafer is arranged in a chamber, and a first source gas is supplied (S10). Next, the first source gas is purged (S20). Subsequently, a second source gas is supplied (S30) and purged (S40). Then, S10 through S40 are repeated (S50) to deposit a thin layer such as a dielectric layer having a desired thickness on the wafer.

In the conventional atomic layer deposition method as illustrated in FIG. 1, a first source gas having a relatively large molecular weight and existing in a solid state at room temperature is used and thus the precursor of the first source gas is used with an organic solvent added thereto for volatility and stability. However, when the precursors are vaporized in a vaporizer of the atomic layer deposition apparatus, the precursors are decomposed to metal compounds or organic materials to form precipitable intermediates or leave unvaporized residues in the vaporizer. As a result, a nozzle of the vaporizer can be blocked or the operating capability of the vaporizer can deteriorate.

SUMMARY

The present invention provides an in-situ method of cleaning a vaporizer of an atomic layer deposition apparatus during a dielectric layer deposition process to prevent nozzle blocking in the vaporizer.

According to an embodiment of the present invention, there is provided an in-situ method of cleaning a vaporizer of an atomic layer deposition apparatus during a dielectric layer deposition process, the dielectric layer deposition process comprising repeating the steps of: supplying a first source gas for dielectric layer deposition into a chamber of the atomic layer deposition apparatus, the chamber for depositing dielectric layers of semiconductor devices; purging the first source gas; supplying a second source gas into the chamber of the atomic layer deposition apparatus; and purging the second source gas, wherein a process of cleaning an inside of the vaporizer of the atomic layer deposition apparatus is performed after supplying the first source gas for dielectric layer deposition and before supplying the first source gas again.

The process of cleaning the inside of the vaporizer may be performed synchronously with purging the first source gas, or synchronously with supplying the second source gas into the chamber of the atomic layer deposition apparatus.

The first source gas exists in a liquid or solid state at room temperature and may be dissolved in an organic solvent before being supplied into the chamber of the atomic layer deposition apparatus. The process of cleaning the inside of the vaporizer may be performed using an organic solvent having a temperature the same as or higher than a vaporization temperature of the first source gas, or using one selected from a group of pressurized gases consisting of nitrogen, argon and helium.

Alternatively, the process of cleaning the inside of the vaporizer may be performed by flowing an organic solvent into the vaporizer and applying a pressurized gas.

The atomic layer deposition apparatus may comprise: a sealed chamber in which dielectric layer of semiconductor devices is deposited; a vaporizer which is connected to the chamber; a first source gas supply unit supplying the first source gas to the vaporizer; a vaporizer cleaning unit supplying the vaporizer with the organic solvent and pressurized gas for vaporizer cleaning; a second source gas supply unit supplying the second source gas to the chamber; a vacuum pump which is connected to the chamber; and a bypass line which is diverged from a connecting line between the chamber and vaporizer and connected to the vacuum pump.

The vaporizer cleaning unit may comprise a liquid delivery system (LDS).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
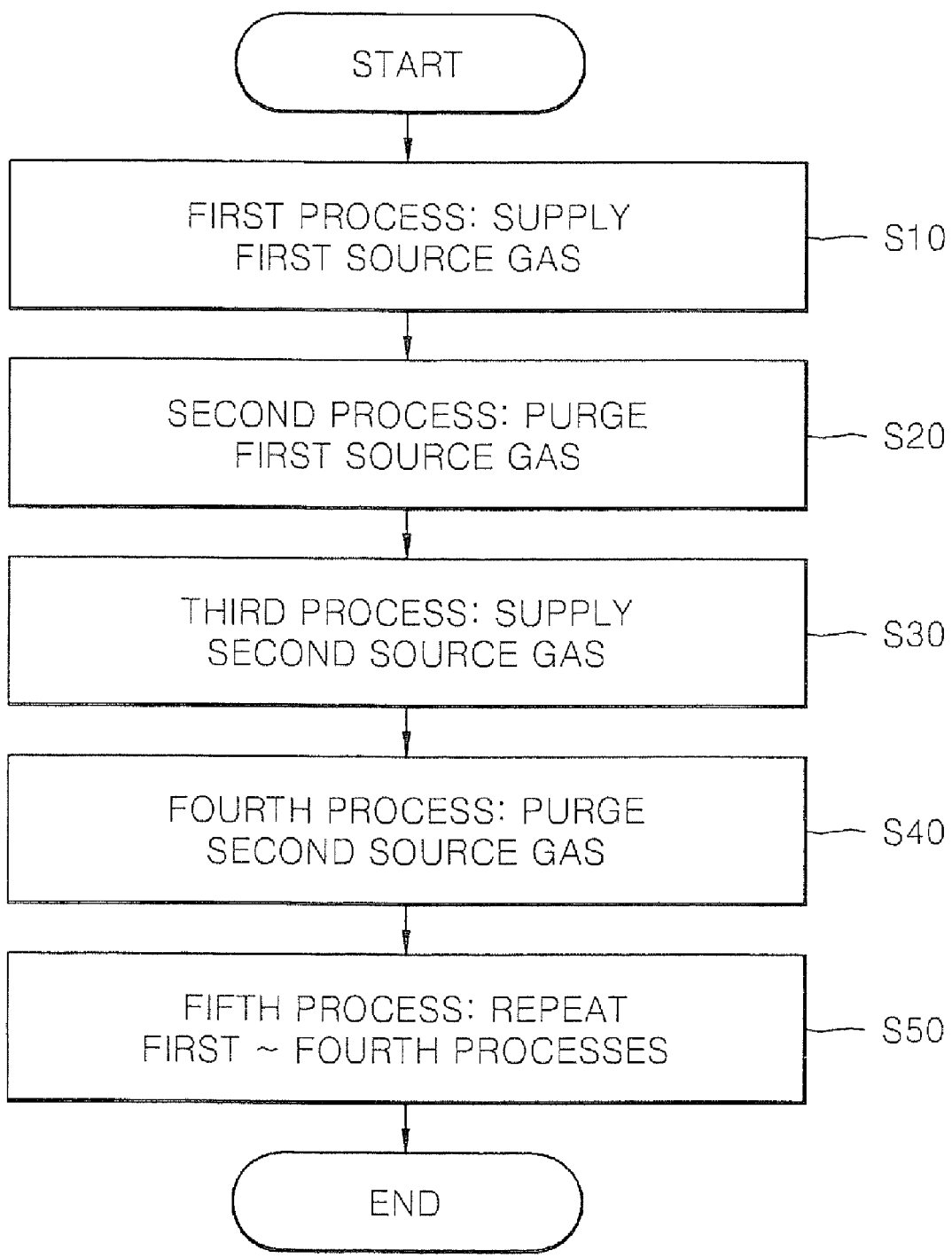
FIG. 1 is a flowchart illustrating a conventional atomic layer deposition method of forming dielectric layers of semiconductor memory devices.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
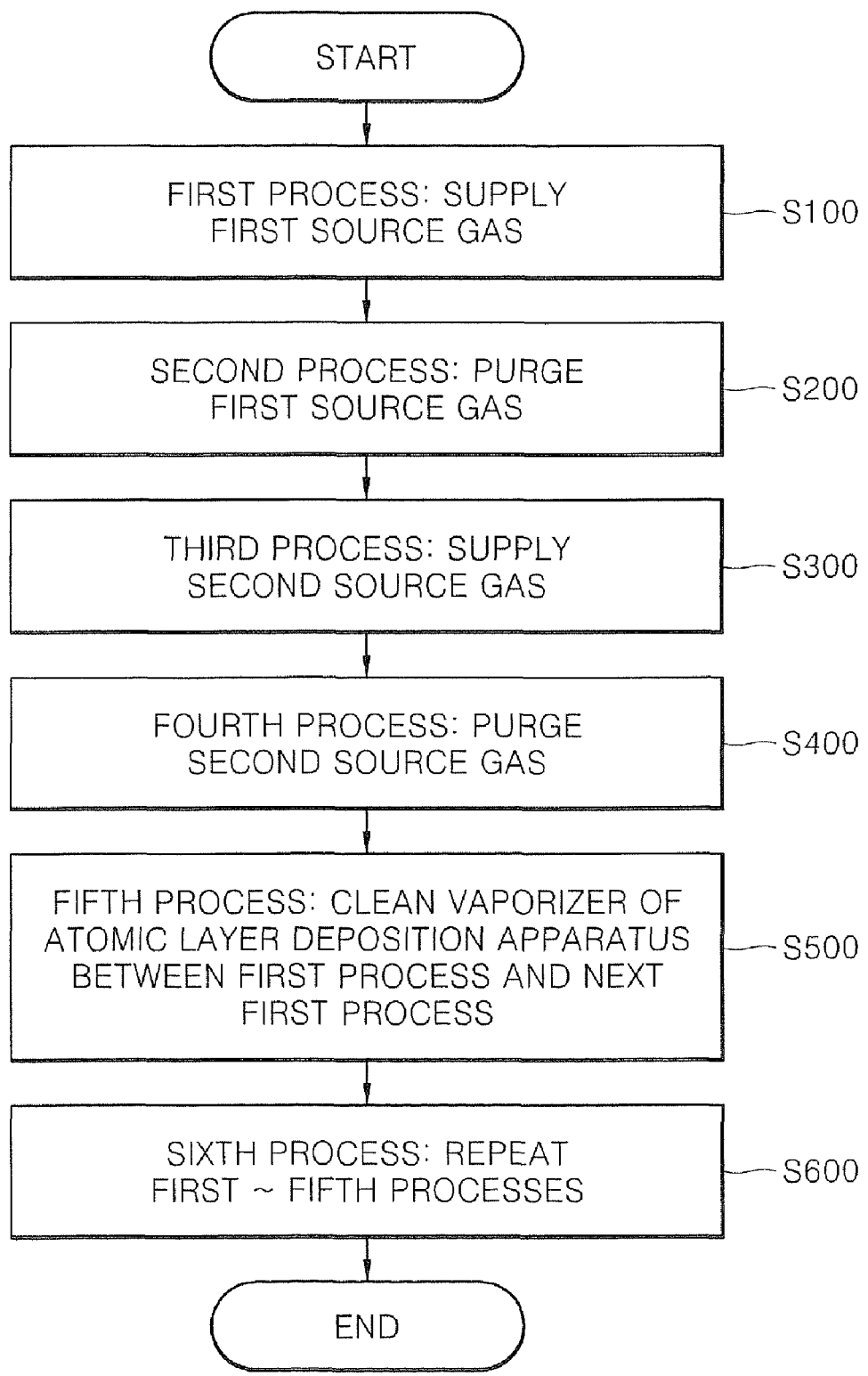
FIG. 2 is a flowchart illustrating an in-situ method of cleaning a vaporizer of an atomic layer deposition apparatus during a dielectric layer deposition process, according to an embodiment of the present invention.

FIG. 2 is a flowchart illustrating an in-situ method of cleaning a vaporizer of an atomic layer deposition apparatus during a dielectric layer deposition process, according to an embodiment of the present invention.

Referring to FIG. 2, the in-situ method of cleaning a vaporizer of an atomic layer deposition apparatus during a dielectric layer deposition process according to an embodiment of the present invention includes a first step S100 in which a first source gas for dielectric layer deposition is supplied into a chamber of an atomic layer deposition apparatus, a second step S200 in which the first source gas is purged, a third step S300 in which a second source gas is supplied into the chamber of the atomic layer deposition apparatus, a fourth step S400 in which the second source gas is purged, a fifth step S500 in which the inside of a vaporizer of the atomic layer deposition apparatus is cleaned after the first process and prior to performing the first step S100 again, and a sixth step S600 in which the first through fifth steps S100 through S500 are repeated, in order to form a high-k dielectric layer on a wafer in the chamber of the atomic layer deposition apparatus.

The fifth step S500 of cleaning the inside of the vaporizer can be performed synchronously with the second step S200 in which the first source gas is purged or with the third step S300 in which the second source gas is supplied into the chamber of the atomic layer deposition apparatus so that the inside of the vaporizer can be cleaned using an in-situ method without an increase in processing time. Here, the first source gas has a large molecular weight and is in a liquid or solid state at room temperature and thus may be dissolved in organic solvents before being supplied into the chamber of the atomic layer deposition apparatus.

The fifth step S500 of cleaning the inside of the vaporizer may be performed using an organic solvent wherein the temperature of the organic solvent is the same as or higher than a vaporization temperature of the first source gas or using at least one selected from a group of pressurized gases including nitrogen, argon and helium. Also, the cleaning can be performed by firstly flowing the organic solvent inside the vaporizer and subsequently applying the pressurized gases. The in-situ method of cleaning a vaporizer during a dielectric layer deposition process according to an embodiment of the present invention can be utilised in the formation of capacitor dielectric layers of semiconductor memory devices or blocking layers in non-volatile memory devices having a SONOS (silicon-oxide-nitride-oxide-silicon) structure.

Figure 3:
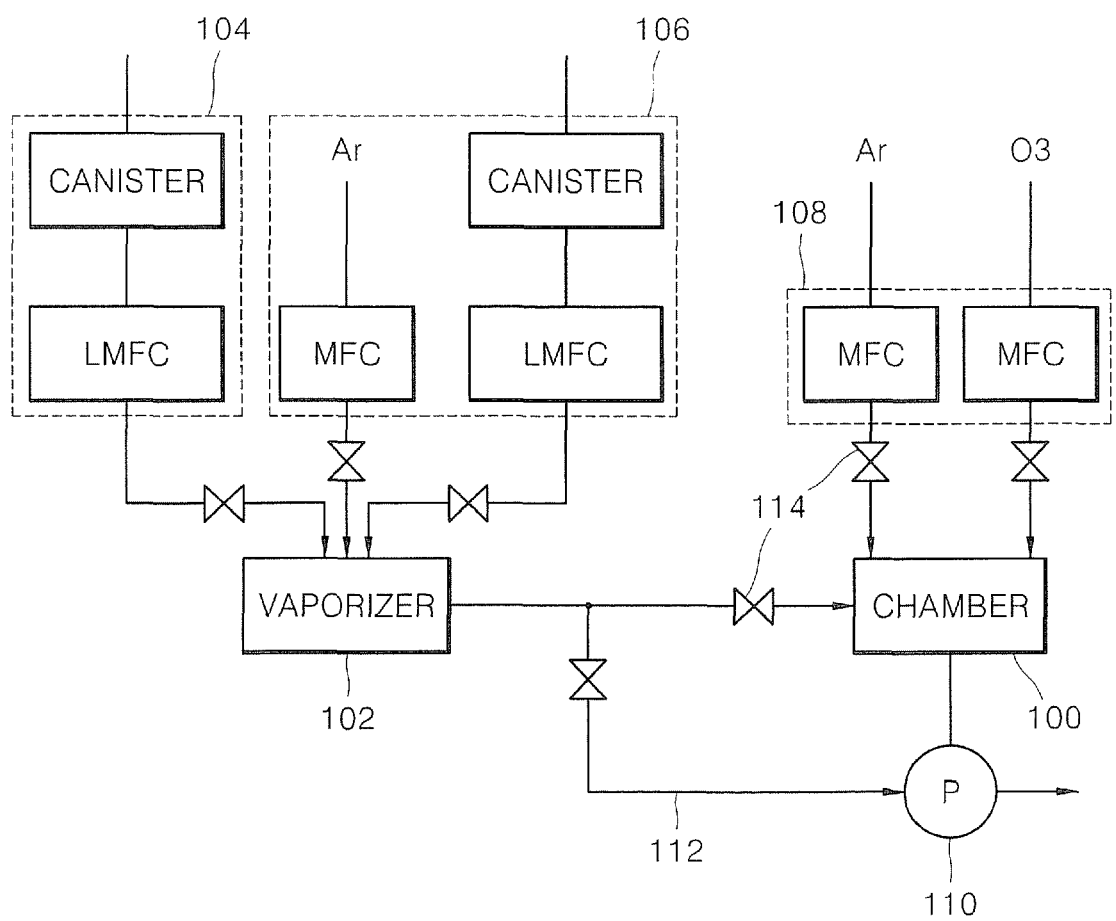
FIG. 3 is a block diagram illustrating an atomic layer deposition apparatus for forming dielectric layers of semiconductor memory devices and performing an in-situ method of cleaning a vaporizer of the atomic layer deposition apparatus, according to an embodiment of the present invention.

FIG. 3 is a block diagram illustrating an atomic layer deposition apparatus for forming dielectric layers of semiconductor devices according to an embodiment of the present invention. Referring to FIG. 3, the atomic layer deposition apparatus for performing the in-situ method of cleaning according to an embodiment of the present invention, includes a sealed chamber 100 for depositing dielectric layers of semiconductor devices, a vaporizer 102 which is connected to the chamber 100, a first source gas supply unit 104 supplying a first source gas into the vaporizer 102, a vaporizer cleaning unit 106 supplying an organic solvent and a pressurized gas for cleaning into the vaporizer 102, a second source gas supply unit 108 supplying a second source gas into the chamber 100, a vacuum pump 110 which is connected to the chamber 100 and a bypass line 112 which is diverged from a connecting line between the chamber 100 and the vaporizer 102 and connected to the vacuum pump 110.

Switching valves 114 control gas flow in the atomic layer deposition apparatus. The second source gas supply unit 108 additionally performs a function of purging the first source gas in the chamber 100 using an inert gas such as argon (Ar).

Therefore, a nozzle (not illustrated) of the vaporizer 102 is prevented from being blocked since the vaporizer cleaning unit 106 cleans the inside of the vaporizer 102 using the organic solvent only or the pressurized gas such as Ar only or by firstly flowing the organic solvent in the vaporizer 102 and secondly applying the pressurized gas (Ar in FIG. 3) through a liquid delivery system (LDS) such as a liquid mass flow controller (LMFC)

The in-situ method of cleaning a vaporizer during a dielectric layer deposition process according to an embodiment of the present invention is described below with reference to FIG. 3. Firstly, the precursor of the first source gas in a liquid state is supplied to the vaporizer 102 and vaporized in the vaporizer 102. Then, the first source gas is deposited to a surface of a wafer in the chamber 100. Next, the first source gas which is not attached to the wafer and remains in a gas state inside the chamber 100 is purged by supplying the inert gas from the second source gas supply unit 108. At the same time, the vaporizer cleaning unit 106 cleans the inside of the vaporizer 102 by flowing the organic solvent into the vaporizer 102 through the LDS such as a LMFC, and after cleaning, flows the organic solvent out of the vaporizer 102 via the bypass line 112, and not to the chamber 100. Subsequently, the second source gas such as $O_3$ is introduced into the chamber 100 and the reactants are purged. At the same time, remaining gases in the vaporizer 102 are purged by flowing an inert gas into the vaporizer 102.

Therefore, according to the present invention, during the formation of a high-k dielectric layer on a wafer in an atomic layer deposition apparatus, nozzle blocking in a vaporizer of the atomic layer deposition apparatus can be prevented by using an in-situ method of cleaning the vaporizer, thereby preventing the operational capability of the atomic layer deposition apparatus or features of high-k dielectric layers from deteriorating. In particular, the high-k dielectric layers can be applied to capacitor dielectric layers of semiconductor memory devices or blocking layers of non-volatile memory devices having a SONOS structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An in-situ method of cleaning a vaporizer of an atomic layer deposition apparatus during a dielectric layer deposition process, the dielectric layer deposition process comprising repeating the steps of:
   supplying a first source gas for dielectric layer deposition into a chamber of the atomic layer deposition apparatus, the chamber for depositing dielectric layers of semiconductor devices;
   purging the first source gas from the chamber;
   supplying a second source gas into the chamber of the atomic layer deposition apparatus; and
   purging the second source gas from the chamber,
   wherein a process of cleaning an inside of the vaporizer of the atomic layer deposition apparatus is performed at the same time as purging the first source gas, and at the same time as supplying the second source gas into the chamber of the atomic layer deposition apparatus, and before supplying the first source gas again.

2. The in-situ cleaning method of claim 1, wherein the second source gas is $O_3$.

3. The in-situ cleaning method of claim 1, wherein the first source gas exists in a liquid or solid state at room temperature and is dissolved in an organic solvent before being supplied into the chamber of the atomic layer deposition apparatus.

4. The in-situ cleaning method of claim 1, wherein, the process of cleaning the inside of the vaporizer is performed using an organic solvent having a temperature the same as or higher than a vaporization temperature of the first source gas.

5. The in-situ cleaning method of claim 1, wherein the process of cleaning the inside of the vaporizer is performed using one selected from a group of pressurized gases consisting of nitrogen, argon and helium.

6. The in-situ cleaning method of claim 1, wherein the process of cleaning the inside of the vaporizer is performed by flowing an organic solvent into the vaporizer and applying a pressurized gas.

7. The in-situ cleaning method of claim 1, wherein the atomic layer deposition apparatus comprises:
- a sealed chamber in which dielectric layer of semiconductor devices is deposited;
- a vaporizer which is connected to the chamber;
- a first source gas supply unit supplying the first source gas to the vaporizer;
- a vaporizer cleaning unit supplying the vaporizer with the organic solvent and pressurized gas for vaporizer cleaning;
- a second source gas supply unit supplying the second source gas to the chamber;
- a vacuum pump which is connected to the chamber; and
- a bypass line which is diverged from a connecting line between the chamber and vaporizer and connected to the vacuum pump.

8. The in-situ cleaning method of claim 7, wherein the vaporizer cleaning unit comprises a liquid delivery system (LDS).

9. An in-situ method of cleaning a vaporizer of an atomic layer deposition apparatus during a dielectric layer deposition process, the dielectric layer deposition process, comprising:
- a) supplying a first source gas for dielectric layer deposition into a chamber of the atomic layer deposition apparatus;
- b) purging the first source gas;
- c) supplying a second source gas into the chamber;
- d) purging the second source gas; and
- e) cleaning an inside of the vaporizer of the atomic layer deposition apparatus after supplying the first source gas;

wherein steps b) and e) are performed at the same time and wherein steps c) and e) are performed at the same time.

10. The in-situ cleaning method of claim 9, comprising repeating steps a) through e).

11. The in-situ cleaning method of claim 9, wherein the second source gas is $O_3$.

12. The in-situ cleaning method of claim 9, wherein the first source gas exists in a liquid or solid state at room temperature and is dissolved in an organic solvent before being supplied into the chamber.

13. The in-situ cleaning method of claim 9, wherein step e) is performed using an organic solvent having a temperature the same as or higher than a vaporization temperature of the first source gas.

14. The in-situ cleaning method of claim 9, wherein step e) is performed using a pressurized gas selected from the group consisting of nitrogen, argon and helium.

15. The in-situ cleaning method of claim 9, wherein step e) is performed by flowing an organic solvent into the vaporizer and applying a pressurized gas.

* * * * *